(12) United States Patent
Suzuki et al.

(10) Patent No.: US 10,405,415 B2
(45) Date of Patent: Sep. 3, 2019

(54) ELECTRO-STATIC DISCHARGE PROTECTION DEVICE

(71) Applicant: Murata Manufacturing Co., Ltd., Nagaokakyo-shi, Kyoto-fu (JP)

(72) Inventors: Mayu Suzuki, Nagaokakyo (JP); Jun Adachi, Nagaokakyo (JP); Takayuki Tsukizawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 366 days.

(21) Appl. No.: 15/296,132

(22) Filed: Oct. 18, 2016

(65) Prior Publication Data

US 2017/0042007 A1 Feb. 9, 2017

Related U.S. Application Data

(63) Continuation of application No. PCT/JP2015/062101, filed on Apr. 21, 2015.

(30) Foreign Application Priority Data

May 9, 2014 (JP) .................................. 2014-097997

(51) Int. Cl.
*H05F 3/04* (2006.01)
*H01T 2/02* (2006.01)
(Continued)

(52) U.S. Cl.
CPC ................. *H05F 3/04* (2013.01); *H01T 1/20* (2013.01); *H01T 2/02* (2013.01); *H01T 4/04* (2013.01);
(Continued)

(58) Field of Classification Search
CPC ..... H05F 3/04; H01T 1/20; H01T 2/02; H01T 4/04; H01T 4/11; H01T 4/12
See application file for complete search history.

(56) References Cited

U.S. PATENT DOCUMENTS

2007/0229208 A1* 10/2007 Nakano .................. H01C 7/112
338/21
2011/0227196 A1 9/2011 Adachi et al.
(Continued)

FOREIGN PATENT DOCUMENTS

| WO | 2010/067503 A1 | 6/2010 |
| WO | 2011/040435 A1 | 4/2011 |
| WO | 2014/027552 A1 | 2/2014 |

OTHER PUBLICATIONS

Official Communication issued in corresponding International Application PCT/JP2015/062101, dated Jun. 23, 2015.

*Primary Examiner* — Scott Bauer
(74) *Attorney, Agent, or Firm* — Keating & Bennett, LLP

(57) ABSTRACT

An electro-static discharge protection device includes a ceramic base material, first and second outer electrodes on the outer surface of the ceramic base material, a hollow portion inside the ceramic base material, a first discharge electrode including a first end portion electrically connected to the first outer electrode and a second end portion in the hollow portion, a second discharge electrode including a first end portion electrically connected to the second outer electrode and a second end portion spaced apart from the first discharge electrode in the hollow portion, and a discharge supporting electrode including silicon carbide and between the second end portion of the first discharge electrode and the second end portion of the second discharge electrode. The elemental alkali metal in the ceramic base material is about 3 percent by weight or less.

19 Claims, 4 Drawing Sheets

(51) Int. Cl.
*H01T 4/04* (2006.01)
*H01T 4/10* (2006.01)
*H01T 4/12* (2006.01)
*H01T 1/20* (2006.01)
*H05K 1/02* (2006.01)
*H01T 1/22* (2006.01)

(52) U.S. Cl.
CPC ................. *H01T 4/10* (2013.01); *H01T 4/12* (2013.01); *H05K 1/026* (2013.01); *H01T 1/22* (2013.01)

(56) References Cited

U.S. PATENT DOCUMENTS

2012/0162838 A1* 6/2012 Sawada ............... H01T 4/12
 361/56
2013/0077199 A1* 3/2013 Ikeda .................. H01T 1/22
 361/56
2015/0155246 A1 6/2015 Tsukizawa et al.

* cited by examiner

ELECTRO-STATIC DISCHARGE PROTECTION DEVICE

CROSS REFERENCE TO RELATED APPLICATIONS

This application claims the benefit of priority to Japanese Patent Application 2014-097997 filed May 9, 2014 and is a Continuation Application of PCT/JP2015/062101 filed on Apr. 21, 2015. The entire contents of each of these applications are hereby incorporated herein by reference.

BACKGROUND OF THE INVENTION

1. Field of the Invention

The present invention relates to an electro-static discharge protection device that protects electronic equipment from breakage due to electro-static discharge.

2. Description of the Related Art

To date, electro-static discharge protection devices (ESD protection devices) for suppressing breakage of electronic equipment due to electro-static discharge (ESD) have been widely used.

For example, International Publication No. 2010/067503 describes an ESD protection device including a ceramic multilayer substrate, at least a pair of discharge electrodes disposed on the ceramic multilayer substrate and opposed to each other with a distance therebetween, and outer electrodes disposed on the surface of the ceramic multilayer substrate and connected to the discharge electrodes, wherein a supporting electrode composed of a dispersed metal material and a semiconductor material is included in a region that provides a connection between the pair of discharge electrodes. The ESD protection device described in International Publication No. 2010/067503 includes the supporting electrode that provides a connection between the discharge electrodes and, thereby, ESD characteristics are easily adjusted and stabilized.

In addition, International Publication No. 2011/040435 describes an ESD protection device including a ceramic base material including a glass component and, inside the ceramic base material, opposed electrodes including one of the opposed electrodes and the other of the opposed electrodes, which are disposed such that an end portion of the one and an end portion of the other are opposed to each other with a distance therebetween, and a discharge supporting electrode, which is connected to both of the one of the opposed electrodes and the other of the opposed electrodes of the opposed electrodes and which is arranged so as to span from the one of the opposed electrodes to the other of the opposed electrodes, wherein a seal layer that prevents intrusion of a glass component from the ceramic base material into the discharge supporting electrode is disposed between the discharge supporting electrode and the ceramic base material.

International Publication No. 2010/067503 and International Publication No. 2011/040435 describe ESD protection devices in which a pair of discharge electrodes are opposed to one another in a hollow portion located in the ceramic base material. In the case where a voltage of a certain value or higher is applied to the ESD protection device having such a configuration, aerial discharge and creepage discharge occur in a portion in which the discharge electrodes are opposed to each other. Therefore, the discharge characteristics of the ESD protection device are determined depending on the clearance between the discharge electrodes and the volume of the hollow portion. Consequently, in order to stably provide predetermined ESD protection performance, it is effective to accurately set the distance between the discharge electrodes and the volume of the hollow portion.

Movement of electrons between the discharge electrodes is facilitated by disposing the discharge supporting electrode in the portion in which the pair of discharge electrodes are opposed to each other so as to efficiently generate a discharge phenomenon and, thereby, the ESD response can be improved. Discharge supporting electrodes containing metal materials and/or semiconductor materials are known (i.e., International Publication No. 2010/067503). However, where the discharge supporting electrode contains silicon carbide (SiC) as a semiconductor material, the volume of the hollow portion may be expanded by gas generation in the production process of the ESD protection device, and a problem of the hollow portion being deformed may occur. Such deformation of the hollow portion may cause the occurrence of cracking and the occurrence of peeling of the discharge electrode in the ESD protection device. Peeling of the discharge electrode causes an increase in distance between the discharge electrodes and, as a result, the discharge characteristics of the ESD protection device may be degraded. Further, discharge characteristics may not be exhibited in some cases.

SUMMARY OF THE INVENTION

Preferred embodiments of the present invention reduce or prevent the occurrence of cracking and peeling of the discharge electrode resulting from gas generation in a production process so as to provide an electro-static discharge protection device having good discharge characteristics.

The inventors of preferred embodiments of the present invention performed repeated research and, as a result, discovered that the gas generation was caused by a reaction between an alkali metal and SiC included in a ceramic base material. In addition, the inventors of preferred embodiments of the present invention discovered that it was possible to reduce or prevent, by decreasing the content of elemental alkali metal in the ceramic base material, gas generation and the occurrence of cracking and peeling of the discharge electrode that were caused by the gas generation. Consequently, preferred embodiments of the present invention were conceived of and developed.

According to a preferred embodiment of the present invention, an electro-static discharge protection device includes a ceramic base material, first and second outer electrodes disposed on the outer surface of the ceramic base material, a hollow portion located inside the ceramic base material, a first discharge electrode including a first end portion that is electrically connected to the first outer electrode and a second end portion that is disposed in the hollow portion, a second discharge electrode including a first end portion that is electrically connected to the second outer electrode and a second end portion that is spaced apart from the first discharge electrode in the hollow portion, and a discharge supporting electrode, which includes silicon carbide and which is disposed between the second end portion of the first discharge electrode and the second end portion of the second discharge electrode, wherein the content of elemental alkali metal in the ceramic base material is about 3 percent by weight or less.

According to another preferred embodiment of the present invention, an electro-static discharge protection device includes a ceramic base material, first and second outer electrodes disposed on the outer surface of the ceramic base material, a hollow portion located inside the ceramic base material, a first discharge electrode in which a first end portion is electrically connected to the first outer electrode and a second end portion is disposed in the hollow portion, a second discharge electrode in which a first end portion is electrically connected to the second outer electrode and a second end portion is spaced apart from the first discharge electrode in the hollow portion, and a discharge supporting electrode, which includes silicon carbide and which is disposed between the second end portion of the first discharge electrode and the second end portion of the second discharge electrode, wherein a seal layer is disposed in at least a portion of the region between the discharge supporting electrode and the ceramic base material, and the content of elemental alkali metal in the ceramic base material is about 5 percent by weight or less.

According to various preferred embodiments of the present invention, the occurrence of cracking and peeling of a discharge electrode resulting from gas generation in a production process is significantly reduced or prevented, and an electro-static discharge protection device having good discharge characteristics is provided.

The above and other elements, features, steps, characteristics and advantages of the present invention will become more apparent from the following detailed description of the preferred embodiments with reference to the attached drawings

DETAILED DESCRIPTION OF THE PREFERRED EMBODIMENTS

The preferred embodiments according to the present invention will be described below with reference to the drawings. However, the preferred embodiments described below are for the purpose of exemplification, and the present invention is not limited to the preferred embodiments below.

First Preferred Embodiment

Figure 1:
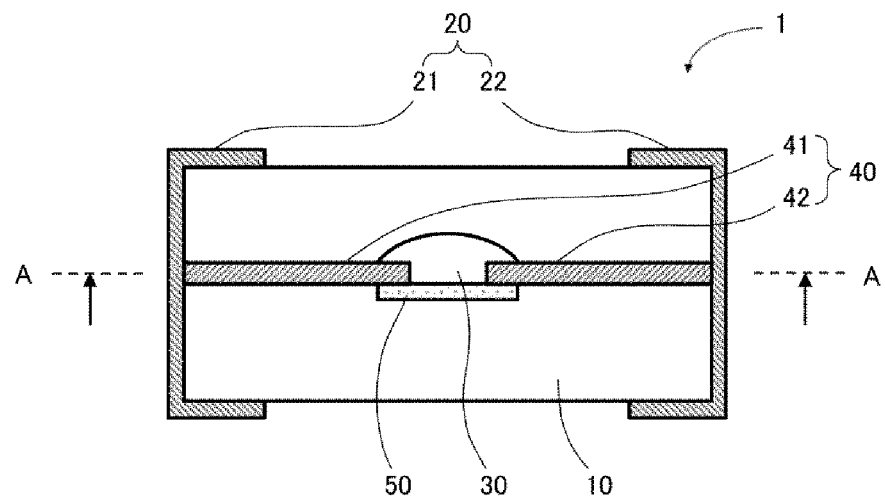
FIG. 1 is a schematic sectional view showing the configuration of an ESD protection device according to a first preferred embodiment of the present invention.

FIG. 1 is a schematic sectional view showing an electrostatic discharge protection device (ESD protection device) according to a first preferred embodiment of the present invention. The ESD protection device 1 shown in FIG. 1 includes a ceramic base material 10, a first outer electrode 21 and a second outer electrode 22 (also collectively referred to as outer electrodes 20) disposed on the outer surface of the ceramic base material 10, a hollow portion 30 located inside the ceramic base material 10, a first discharge electrode 41 in which a first end portion is electrically connected to the first outer electrode 21 and a second end portion is disposed in the hollow portion 30, a second discharge electrode 42 in which a first end portion is electrically connected to the second outer electrode 22 and a second end portion is spaced apart from the first discharge electrode 41 in the hollow portion 30 (the first and second discharge electrodes are also collectively referred to as discharge electrodes 40), and a discharge supporting electrode 50, which preferably includes silicon carbide and which is disposed between the second end portion of the first discharge electrode 41 and the second end portion of the second discharge electrode 42.

Common ceramic materials may be appropriately used as the ceramic base material 10. Specifically, for example, low temperature cofirable ceramics (LTCC) including Ba, Al, and Si as primary components can be preferably used as the ceramic base material 10.

In the present preferred embodiment, the content of elemental alkali metal in the ceramic base material is preferably about 3 percent by weight or less, for example. Usually, the alkali metal element is added to the ceramic base material for the purpose of lowering the softening temperature of the ceramic material. Examples of alkali metal elements include Li, Na, and K.

The alkali metal element included in the ceramic base material 10 may volatilize and diffuse during firing in the production process and may intrude into the discharge supporting electrode 50. On the other hand, the SiC included in the discharge supporting electrode 50 is a stable compound exhibiting low reactivity because $SiO_2$ is present as an oxide film on the particle surfaces. The alkali metal element may extend a gap of the coupling structure of $SiO_2$ and may cause destruction so as to facilitate inward diffusion of oxygen. Consequently, where a large amount of alkali metal element is present in the ceramic base material 10, the alkali metal element in the ceramic base material 10 may intrude into the discharge supporting electrode 50 during firing and, thereby, at least a portion of the $SiO_2$ oxide film may be destroyed. As a result, a SiC decomposition reaction may occur and result in the generation of $CO_2$ gas. If a large amount of $CO_2$ gas is generated, expansion and deformation of the hollow portion 30 may occur, and cracking may occur. In this regard, even where the occurrence of cracking is not produced, if deformation of the hollow portion 30 occurs, the discharge electrodes 41 and 42 may peel off the discharge supporting electrode 50, and the distance between the discharge electrodes (indicated by 43 in FIG. 4) may increase. Also, where the occurrence of peeling is not produced, a fixing force between the discharge electrodes 41 and 42 and the discharge supporting electrode 50 is likely to be reduced. The discharge characteristics of the ESD protection device may be degraded by an increase in the distance between the discharge electrodes and a volume expansion of the hollow portion, and the resistance to repetition may be degraded by a reduction in the fixing force between the discharge electrodes 41 and 42 and the discharge supporting electrode 50. Further, the characteristics as the ESD protection device may not always exhibited.

The $CO_2$ gas generation is reduced or prevented and the occurrence of cracking and peeling of the discharge electrode is prevented by setting the content of elemental alkali metal in the ceramic base material 10 to be about 3 percent by weight or less, for example. As a result, an ESD protection device having good discharge characteristics is obtained. The content of elemental alkali metal in the ceramic base material is preferably about 0.1 to about 1 percent by weight, for example. Where the content of elemental alkali metal is set to be about 1 percent by weight or less, the gas generation is further reduced or prevented, and an ESD protection device having improved discharge characteristics is obtained. Where the content of elemental alkali metal is set to be about 0.1 percent by weight or more, the effects (lowering of the softening temperature) of adding the alkali metal element are able to be sufficiently achieved.

The content of elemental alkali metal in the ceramic base material 10 can be appropriately measured by utilizing a common method. Specifically, for example, the measurement can be performed by atomic absorption spectrometry (AAS), inductively coupled plasma (ICP) emission spectrometry, and other suitable methods. Regarding the quantification of the alkali metal element, it is preferable that ICP emission spectrometry be used. In the present specification, the content of elemental alkali metal in the ceramic base material 10 refers to the value quantified with respect to a bulk portion of the ceramic base material 10.

Figure 2:
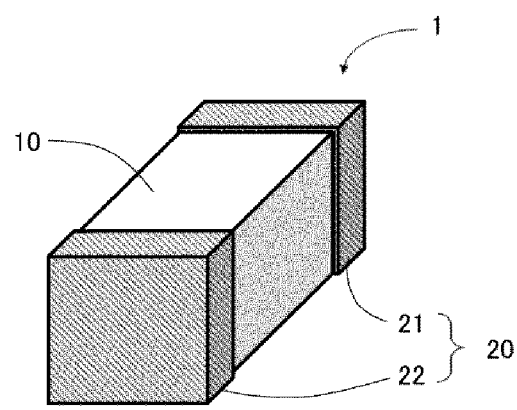
FIG. 2 is a perspective view showing an example of the arrangement of outer electrodes in the ESD protection device according to the first preferred embodiment of the present invention.
Figure 3:
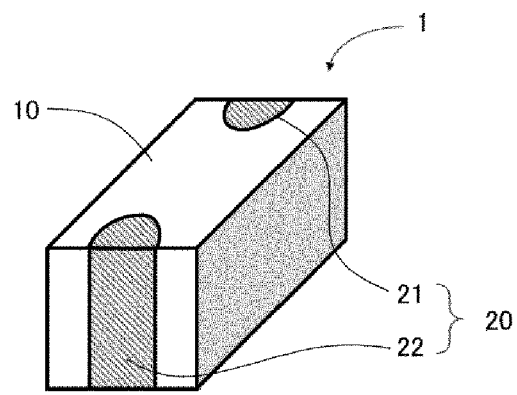
FIG. 3 is a perspective view showing another example of the arrangement of outer electrodes in the ESD protection device according to the first preferred embodiment of the present invention.

The first outer electrode 21 and the second outer electrode 22 are disposed on the outer surface of the ceramic base material 10. Examples of metal materials that may preferably be used for the first outer electrode 21 and the second outer electrode 22 include alloys of Cu, Ag, Pd, Ni, and other suitable alloys and combinations thereof. The metal materials may preferably be particulate and may be spherical, flat, or other suitable shapes, or combinations thereof. The first outer electrode 21 and the second outer electrode 22 may preferably include a glass material, in addition to the metal material. One type of glass material may be used alone, or glass materials having different softening temperatures may be used in combination. For example, the first outer electrode 21 and the second outer electrode 22 may preferably be arranged so as to cover both end surfaces of the ceramic base material 10 and to extend to at least a portion of each of the side surfaces of the ceramic base material 10, as shown in FIG. 2, or may preferably be arranged so as to be embedded in both end surfaces of the ceramic base material 10, as shown in FIG. 3. The present invention is not limited to these configurations.

The hollow portion 30 is located inside the ceramic base material 10. There is no particular limitation regarding the dimensions and the shape of the hollow portion 30 as long as the portion, in which the end portion of the first discharge electrode 41 and the end portion of the second discharge electrode 42 are opposed to each other, is provided in the hollow portion 30. For example, as shown in FIG. 1, a shape with an upper side including a curved surface or another shape, e.g., a rectangle or a circular column, can be appropriately provided.

The ESD protection device 1 includes the first discharge electrode 41 and the second discharge electrode 42. The first end portion of the first discharge electrode 41 is electrically connected to the first outer electrode 21, and the second end portion of the first discharge electrode 41 is provided in the hollow portion 30. The first end portion of the second discharge electrode 42 is electrically connected to the second outer electrode 22, and the second end portion of the second discharge electrode 42 is provided in the hollow portion 30. The second end portion of the first discharge electrode 41 is spaced apart from the second end portion of the second discharge electrode 42 in the hollow portion 30, and discharge occurs in the clearance therebetween.

Figure 4:
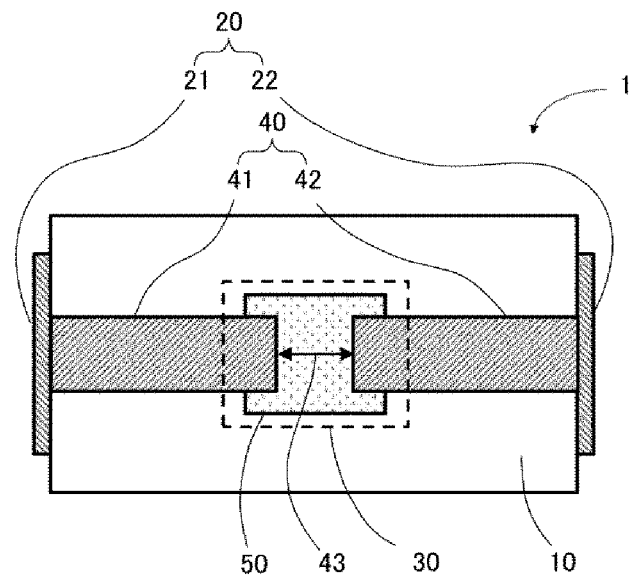
FIG. 4 is a schematic plan view showing an example of the arrangement of discharge electrodes in an ESD protection device according to a preferred embodiment of the present invention.

FIG. 4 is a schematic plan view showing an example of arrangement of the discharge electrodes in the ESD protection device according to a preferred embodiment of the present invention. As shown in FIG. 4, the first discharge electrode 41 and the second discharge electrode 42 may preferably be arranged such that the second end portion of the first discharge electrode 41 and the second end portion of the second discharge electrode 42 are disposed so as to oppose each other. In the arrangement shown in FIG. 4, the distance 43 between the discharge electrodes refers to the distance between the end portions of the first discharge electrode 41 and the second discharge electrode 42. In this regard, in the present specification, "distance between discharge electrodes" refers to a minimum distance between the first discharge electrode and the second discharge electrode on a plane on which the discharge electrodes and the discharge supporting electrode are in contact with each other.

Figure 5:
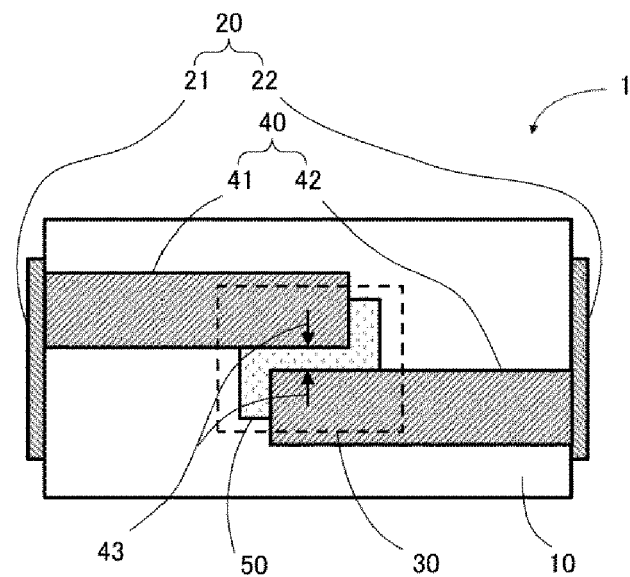
FIG. 5 is a schematic plan view showing another example of the arrangement of discharge electrodes in an ESD protection device according to a preferred embodiment of the present invention.

In another configuration, the first discharge electrode 41 and the second discharge electrode 42 may preferably be arranged parallel or substantially parallel to each other in plan view, as shown in FIG. 5, rather than being opposed to each other. In the arrangement shown in FIG. 5, the first discharge electrode 41 and the second discharge electrode 42 are arranged such that a portion of the side portion between the first end portion and the second end portion of the first discharge electrode and a portion of the side portion between the first end portion and the second end portion of the second discharge electrode are disposed so as to oppose each other in plan view. In this configuration, the distance 43 between the discharge electrodes refers to the distance between the side portions of the first discharge electrode 41 and the second discharge electrode 42.

In this regard, in the configurations shown in FIGS. 4 and 5, the hollow portion 30 preferably has dimensions that are larger than the dimensions of the discharge supporting electrode 50 in plan view, but the present invention is not limited to these configurations. The hollow portion 30 may have dimensions smaller than the dimensions of the discharge supporting electrode 50 in plan view.

Figure 6:
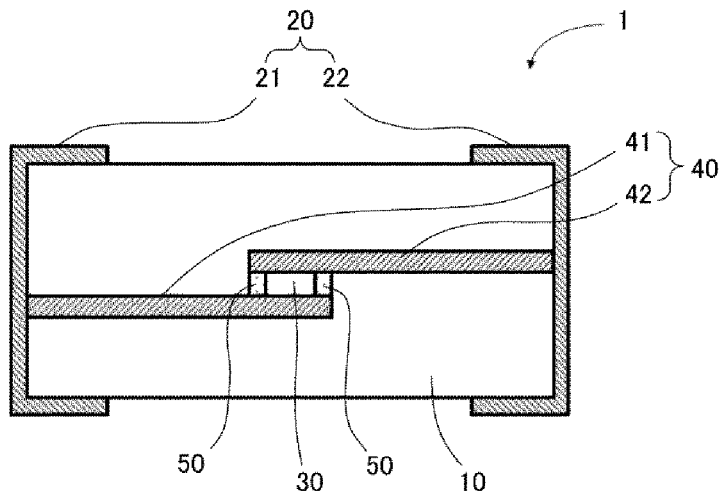
FIG. 6 is a schematic sectional view showing another example of the arrangement of discharge electrodes in an ESD protection device according to a preferred embodiment of the present invention.

In another configuration, as shown in FIG. 6, the first discharge electrode 41 and the second discharge electrode 42 may preferably be arranged parallel or substantially parallel to each other in the height direction. In the configuration shown in FIG. 6, the first discharge electrode 41 and the second discharge electrode 42 are arranged such that a portion of the upper portion between the first end portion and the second end portion of the first discharge electrode 41 and a portion of the lower portion between the first end portion and the second end portion of the second discharge electrode 42 are disposed so as to oppose each other in the height direction. In this configuration, the distance between the discharge electrodes refers to the distance between the upper portion of the first discharge electrode 41 and the lower portion of the second discharge electrode 42. As shown in FIG. 6, the discharge supporting electrode 50 can be arranged between the second end portion of the first discharge electrode 41 and the second end portion of the second discharge electrode 42 in the portion in which the first discharge electrode 41 and the second discharge electrode 42 are opposed to each other. The configuration shown in FIG. 6 preferably includes two discharge supporting electrodes 50, for example. One discharge supporting electrode 50 may be arranged so as to connect the second end portion of the first discharge electrode 41 to the lower portion of the second discharge electrode 42, and the other discharge supporting electrode 50 may be arranged so as to connect the second end portion of the second discharge electrode 42 to the upper portion of the first discharge electrode 41.

The distance 43 between the discharge electrodes can be appropriately set in accordance with the predetermined discharge characteristics. Specifically, the distance 43 between the discharge electrodes can preferably be set to be, for example, about 5 μm to about 50 μm.

Examples of metal materials usable for the first discharge electrode 41 and the second discharge electrode 42 include Ni, Ag, Pd, alloys thereof, and combinations of some of the above-described materials.

The discharge supporting electrode 50 is arranged between the second end portion of the first discharge electrode 41 and the second end portion of the second discharge electrode 42. In this regard, the discharge supporting electrode 50 need only be present in at least a portion in which the second end portion of the first discharge electrode 41 and the second end portion of the second discharge electrode 42 are opposed to each other. However, the discharge supporting electrode 50 may be disposed between the first discharge electrode 41 and the ceramic base material 10 and between the second discharge electrode 42 and the ceramic base material 10 in addition to between the second end portion of the first discharge electrode 41 and the second end portion of the second discharge electrode 42.

The discharge supporting electrode 50 includes silicon carbide (SiC) as a semiconductor material. Where SiC is present in the discharge supporting electrode 50, discharge through the discharge supporting electrode 50, in addition to creepage discharge and aerial discharge, can be generated as discharge between the discharge electrodes. Usually, among creepage discharge, aerial discharge, and discharge through the discharge supporting electrode 50, the starting voltage of the discharge through the discharge supporting electrode 50 is the lowest. Therefore, the discharge starting voltage is able to be lowered by disposing the discharge supporting electrode 50. As a result, dielectric breakdown of the ESD protection device 1 is effectively reduced or prevented, and the response of the ESD protection device 1 is improved.

The average particle diameter of SiC is preferably about 0.1 μm to about 5 μm, for example. If the average particle diameter of SiC is about 0.1 μm or more, good ESD discharge characteristics are obtained. If the average particle diameter of SiC is about 5 μm or less, good insulation resistance are obtained. Also, the content of SiC in the discharge supporting electrode 50 is preferably about 15 to about 70 percent by weight, for example. If the content of SiC is about 15 percent by weight or more, the insulation resistance is further improved. If the content of SiC is about 70 percent by weight or less, ESD discharge characteristics is further improved.

Figure 7:
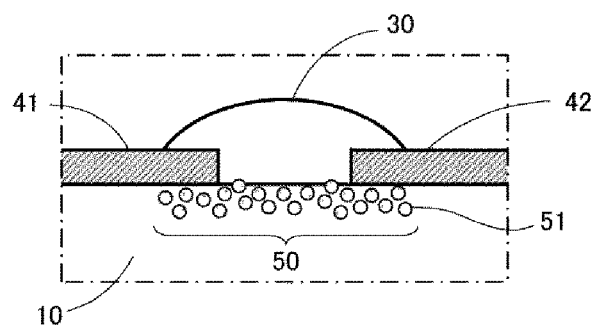
FIG. 7 is a magnified sectional view showing an example of a discharge supporting electrode in an ESD protection device according to a preferred embodiment of the present invention.

The discharge supporting electrode 50 may preferably further include conductor materials, e.g., metal materials, semiconductor materials other than SiC, ceramic materials, and combinations of some of the above materials, in addition to SiC. Each of materials including SiC particles is dispersed within the discharge support electrode 50 and the discharge supporting electrode 50 only needs to have an insulating property as a whole. FIG. 7 is a schematic diagram showing an example of a discharge supporting electrode 50 including a ceramic material of the same or substantially the same type as the ceramic base material 10 and SiC. In FIG. 7, SiC particles 51 in the discharge supporting electrode 50 are dispersed in the ceramic material (not shown in the drawing).

Regarding the conductor materials, Cu, Ag, Pd, Pt, Al, Ni, W, Mo, alloys thereof, combinations of some of the above materials, and other suitable materials for example, may be used, but the conductor materials are not limited to these. The diameters of conductor material particles can preferably be set to be, for example, about 0.1 μm to about 3 μm. Alternatively, conductor material particles with the surfaces coated with an inorganic material may be used. For example, inorganic oxides, e.g., $Al_2O_3$, and ceramic materials (materials containing constituents of ceramic base material and other suitable materials) can be used as the inorganic coating material.

Examples of semiconductor materials other than SiC include carbides, e.g., titanium carbide, zirconium carbide, molybdenum carbide, and tungsten carbides, nitrides, e.g., titanium nitride, zirconium nitride, chromium nitride, vanadium nitride, and tantalum nitride, silicides, e.g., titanium silicide, zirconium silicide, tungsten silicide, molybdenum silicide, and chromium silicide, borides, e.g., titanium boride, zirconium boride, chromium boride, lanthanum boride, molybdenum boride, and tungsten boride, and oxides, e.g., zinc oxide and strontium oxide, but are not limited to these materials.

The ceramic material including the same components as at least a portion of the components of the ceramic base material 10 may preferably be used. Where such a configuration is provided, the shrinkage behavior and other behaviors of the discharge supporting electrode 50 are able to be easily matched with the shrinkage behavior and other behaviors of the ceramic base material 10, close contact of the discharge supporting electrode 50 with the ceramic base material 10 is improved, and peeling of the discharge supporting electrode 50 during firing does not readily occur. Also, resistance to ESD repetition is improved. Further, the number of different types of the materials to be used is decreased and, thus, the production cost is able to be reduced. However, the ceramic material is not limited to those described above, and various ceramic materials are able to be appropriately used.

The discharge supporting electrode 50 may preferably further include insulating particles of aluminum oxide or other suitable materials, for example.

Second Preferred Embodiment

Figure 8:
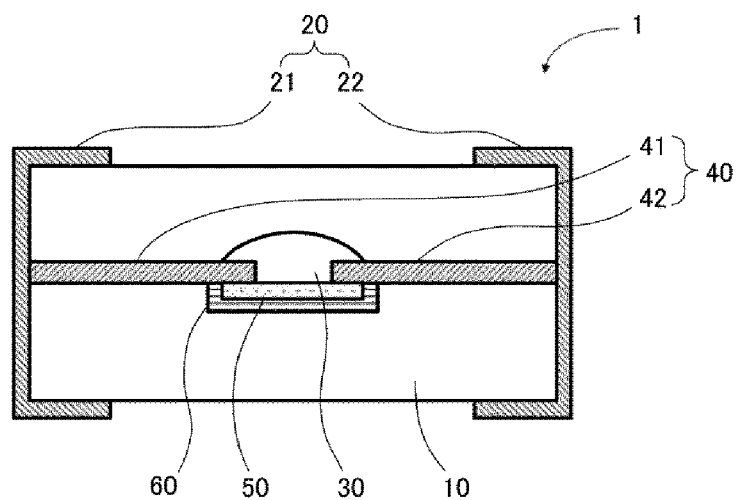
FIG. 8 is a schematic sectional view showing the configuration of an ESD protection device according to a second preferred embodiment of the present invention.

An ESD protection device according to a second preferred embodiment of the present invention will be described below with reference to FIG. 8. FIG. 8 is a schematic sectional view showing the configuration of the ESD protection device according to the second preferred embodiment of the present invention. An ESD protection device 1 shown in FIG. 8 includes a ceramic base material 10, a first outer electrode 21 and a second outer electrode 22 disposed on the outer surface of the ceramic base material 10, a hollow portion 30 inside the ceramic base material 10, a first discharge electrode 41 in which a first end portion is electrically connected to the first outer electrode 21 and a second end portion is disposed in the hollow portion 30, a second discharge electrode 42 in which a first end portion is electrically connected to the second outer electrode 22 and a second end portion is spaced apart from the first discharge electrode 41 in the hollow portion 30, and a discharge supporting electrode 50, which includes silicon carbide and which is disposed between the second end portion of the first discharge electrode 41 and the second end portion of the second discharge electrode 42, wherein a seal layer 60 is disposed in at least a portion of the region between the discharge supporting electrode 50 and the ceramic base material 10. The second preferred embodiment will be described below primarily focusing on the points that are different from the first preferred embodiment, and the same explanations as those for the first preferred embodiment are applied unless otherwise specified.

In the present preferred embodiment, the seal layer 60 is disposed in the region between the discharge supporting electrode 50 and the ceramic base material 10. The seal layer 60 is provided to prevent the alkali metal element in the ceramic base material 10 from intruding or diffusing into the discharge supporting electrode 50. There is no particular limitation regarding the material used for the seal layer 60, and materials exhibiting low reactivity with the ceramic base material 10 can be appropriately used. Specifically, for example, the seal layer 60 may preferably include $Al_2O_3$ as a primary component. The thickness of the seal layer 60 is preferably about 3 μm to about 20 μm, for example. If the thickness of the seal layer 60 is about 3 μm or more, the alkali metal element in the ceramic base material 10 is effectively prevented from intruding or diffusing into the discharge supporting electrode 50. If the thickness of the seal layer 60 is about 20 μm or less, occurrences of deformation and cracking resulting from a difference in shrinkage behavior between the seal layer 60 and the ceramic base material 10 are effectively reduced or prevented.

In the present preferred embodiment, the content of elemental alkali metal in the ceramic base material 10 is preferably about 5 percent by weight or less, for example. The seal layer 60 is disposed in at least a portion of the region between the discharge supporting electrode 50 and the ceramic base material 10 and, thus, the amount of diffusion of the alkali metal element into the discharge supporting electrode 50 is decreased. Therefore, even where the content of elemental alkali metal in the ceramic base material 10 is more than about 3 percent by weight, if the content is about 5 percent by weight or less, the occurrence of cracking and peeling of the discharge electrodes 40 is still effectively prevented, and the ESD protection device having good discharge characteristics is obtained.

The content of elemental alkali metal in the ceramic base material is preferably about 0.1 to about 3 percent by weight, for example. Where the content of elemental alkali metal is set to be about 3 percent by weight or less, gas generation is further reduced or prevented, and the ESD protection device having better discharge characteristics is obtained. Where the content of elemental alkali metal is set to be about 0.1 percent by weight or more, effects (lowering of the softening temperature) of the addition of the alkali metal element are sufficiently achieved.

Figure 9:
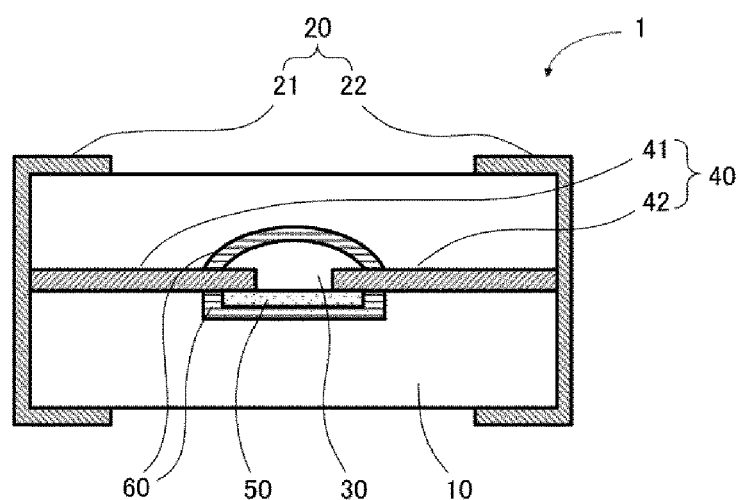
FIG. 9 is a schematic sectional view showing the configuration of a modified example of the ESD protection device according to the second preferred embodiment of the present invention.

As shown in FIG. 9, it is preferable that the seal layer cover substantially the entire inner surface of the hollow portion 30. Not only is the seal layer 60 disposed in the region between the discharge supporting electrode 50 and the ceramic base material 10, but the seal layer 60 also covers substantially the entire inner surface of the hollow portion 30. Therefore, the intrusion or diffusion of volatile components derived from the alkali metal element in the ceramic base material 10 into the discharge supporting electrode 50 through the hollow portion 30, which may occur during firing, is effectively prevented. As a result, the occurrence of cracking and peeling of the discharge electrodes 40 is even more effectively prevented, and the ESD protection device having better discharge characteristics is obtained.

A non-limiting example of a method for manufacturing the ESD protection device will be described below. However, the present invention is not limited to the methods described below.

A ceramic green sheet for forming the ceramic base material is prepared.

Each of raw materials for forming a ceramic material constituting the ceramic base material is compounded and mixed such that the content of elemental alkali metal is about 3 percent by weight or less (about 5 percent by weight or less in the case where the seal layer is included), and calcination is performed at about 800° C. to about 1,000° C. The resulting calcined powder is pulverized in a zirconia ball mill for about 12 hours so as to obtain a ceramic powder. In this regard, the content of elemental alkali metal in the ceramic material is substantially the same as the content of elemental alkali metal in the ceramic base material in the completed product of the ESD protection device. An organic solvent, e.g., toluene or EKINEN, is added to the resulting ceramic powder and mixing is performed. A binder, a plasticizer, and other suitable ingredients are added to the resulting mixture, and mixing is further performed so as to obtain a slurry. The resulting slurry is subjected to forming by a doctor blade method so as to obtain a ceramic green sheet having a predetermined thickness.

A discharge supporting electrode paste for forming the discharge supporting electrode is prepared.

Predetermined proportions of SiC powder having a predetermined average particle diameter and, as necessary, a conductor material, a semiconductor material other than SiC and/or a ceramic material, and an organic vehicle obtained by dissolving a binder, e.g., ethyl cellulose, into an organic solvent, e.g., terpineol, are compounded and mixing is performed using a triple-roll mill or other suitable mixing device so as to prepare the discharge supporting electrode paste.

A discharge electrode paste for forming the discharge electrode is prepared.

Predetermined proportions of Cu powder having a predetermined average particle diameter and organic vehicle obtained by dissolving a binder, e.g., ethyl cellulose, into an organic solvent, e.g., terpineol, are compounded and mixing is performed by using a triple-roll mill or other suitable mixing device so as to prepare the discharge electrode paste.

A hollow-portion-forming paste for forming the hollow portion is prepared. A resin that is decomposed and eliminated during firing can preferably be used as the hollow-portion-forming paste. For example, PET, polypropylenes, ethyl cellulose, acrylic resins, and other suitable materials can be used.

Specifically, for example, predetermined proportions of cross-linked acrylic resin beads having a predetermined average particle diameter and organic vehicle obtained by dissolving a binder, e.g., ethyl cellulose, into an organic solvent, e.g., terpineol, are compounded and mixing is performed by using a triple-roll mill or other suitable mixing device so as to prepare the hollow-portion-forming paste.

An outer electrode paste for forming the outer electrode is prepared.

Predetermined proportions of Cu powder having a predetermined average particle diameter, borosilicate alkali glass frit having predetermined transition temperature and average particle diameter, and organic vehicle obtained by dissolving a binder, e.g., ethyl cellulose, into an organic solvent, e.g., terpineol, are compounded and mixing is performed by using a triple-roll mill or other suitable mixing device so as to prepare the outer electrode paste.

Where the ESD protection device including the seal layer is produced, a seal layer paste for forming the seal layer is prepared.

An $Al_2O_3$ powder having a predetermined average particle diameter of about 2 um and an organic vehicle are mixed so as to prepare the seal layer paste.

A first ceramic green sheet is coated with a predetermined pattern of the discharge supporting electrode paste. Subsequently, a predetermined pattern of the discharge electrode paste is applied such that a pair of discharge electrode pastes are opposed to each other at a predetermined distance between the discharge electrodes on the discharge supporting electrode paste. A predetermined pattern of the hollow-portion-forming paste is then applied so as to cover the opposite portion of the discharge electrode pastes. A screen printing method or other suitable method may be used as the method for applying each paste. In this regard, for example, where the coating thickness of each paste is relatively large, each paste may be applied such that a dent portion disposed in the ceramic green sheet in advance is filled with each paste sequentially.

Where the ESD protection device including the seal layer is produced, each paste is applied in the following procedure.

A first ceramic green sheet is coated with a predetermined pattern of the seal layer paste. The resulting seal layer paste is coated with a predetermined pattern of the discharge supporting electrode paste. Subsequently, a predetermined pattern of the discharge electrode paste is applied such that a pair of the discharge electrode pastes are opposed to each other at a predetermined distance between the discharge electrodes on the discharge supporting electrode paste. Then, a predetermined pattern of the hollow-portion-forming paste is applied so as to cover the opposite portion of the discharge electrode pastes. Finally, a predetermined pattern of the seal layer paste is applied so as to cover the hollow-portion-forming paste. The last seal layer paste may be omitted.

As described above, a second ceramic green sheet is stacked on the first ceramic green sheet coated with the discharge supporting electrode paste, the discharge electrode paste, and the hollow-portion-forming paste in this order, and a multilayer body is obtained by performing pressure bonding such that the total thickness becomes a predetermined thickness.

The resulting multilayer body is cut into a chip having predetermined dimensions using a micro-cutter, and firing is performed in a nitrogen atmosphere at about 900° C. to about 1,000° C. for about 90 minutes. Where the electrode material is Ag or another material that is not oxidized during firing, firing may be performed in an air atmosphere. The hollow-portion-forming paste is decomposed and volatilized by firing so as to form the hollow portion. Also, the organic solvent and the binder present in the ceramic green sheet and each paste are decomposed and volatilized by firing.

Both ends of the fired chip are coated with the outer electrode paste and baking is performed so as to form the outer electrodes. Further, the outer electrodes are subjected to electrolytic Ni—Sn plating so as to complete the ESD protection device.

Regarding the obtained ESD protection device, the occurrence of cracking and peeling of the discharge electrodes are prevented, and good discharge characteristics are exhibited.

Example 1

ESD protection devices of Samples 1 to 7 related to the ESD protection device according to the first preferred embodiment of the present invention were produced in the procedure described below.

Sample 1

The ESD protection device of Sample 1 was produced by the procedure described in (1) to (6) below.

(1) Preparation of Ceramic Green Sheet

A ceramic green sheet including LTCC (low temperature cofirable ceramics), which contains Si and Al as primary components and which does not contain an alkali metal element, was prepared as the material for the ceramic base material. Each of raw materials for forming LTCC was compounded and mixed so as to secure a predetermined composition, and calcination was performed at about 800° C. to about 1,000° C. for 2 about hours. The resulting calcined powder was pulverized in a zirconia ball mill for about 12 hours so as to obtain a ceramic powder. An organic solvent composed of about 35 parts by weight of toluene and about 10 parts by weight of EKINEN was added to about 45 parts by weight of the resulting ceramic powder and mixing was performed. A slurry was obtained by adding about 5 parts by weight of binder and about 5 parts by weight of plasticizer to the resulting mixture and further performing mixing. The resulting slurry was subjected to forming by a doctor blade method so as to obtain first and second ceramic green sheets having a thickness of about 50 μm.

(2-1) Preparation of Discharge Supporting Electrode Paste

The discharge supporting electrode paste was prepared by compounding about 5 parts by weight of SiC powder having an average particle diameter of about 0.5 μm, about 50 parts by weight of Cu powder coated with an inorganic material, and about 45 parts by weight of organic vehicle, which was obtained by dissolving about 10 percent by weight of ethyl cellulose (registered trade mark) resin into terpineol, and performing mixing by using a triple-roll mill.

(2-2) Preparation of Discharge Electrode Paste

The discharge electrode paste was prepared by compounding about 40 parts by weight of Cu powder having an average particle diameter of about 1 μm, about 40 parts by weight of Cu powder having an average particle diameter of about 3 μm, and about parts by weight of organic vehicle, which was obtained by dissolving 10 percent by weight of ethyl cellulose into terpineol, and performing mixing by using a triple-roll mill.

(2-3) Preparation of Hollow-Portion-Forming Paste

The hollow-portion-forming paste was prepared by compounding about 40 parts by weight of cross-linked acrylic resin beads having an average particle diameter of about 1 μm and about parts by weight of organic vehicle, which was obtained by dissolving about 10 percent by weight of ethyl cellulose resin into terpineol and performing mixing by using a triple-roll mill.

(2-4) Preparation of Outer Electrode Paste

The outer electrode paste was prepared by compounding about 75 parts by weight of Cu powder having an average particle diameter of about 1 μm, about 10 parts by weight of borosilicate alkali glass frit having a transition temperature of about 620° C., a softening temperature of about 720° C., and an average particle diameter of about 1 μm, and about 15 parts by weight of organic vehicle, which was obtained by dissolving about 30 percent by weight of ethyl cellulose into terpineol, and performing mixing by using a triple-roll mill.

(3) Application of Each Paste

A first ceramic green sheet was coated with the discharge supporting electrode paste having the dimensions of about 300 μm long, about 200 μm wide, and about 10 μm thick. Subsequently, the discharge electrode paste was applied so as to have dimensions such that a pair of discharge electrode pastes of about 600 μm long, about 100 μm wide, and about 5 μm thick were opposed to each other in the length direction on the discharge supporting electrode paste. The distance between the pair of opposite discharge electrode pastes was set to be about 15 μm. Finally, the hollow-portion-forming paste having the dimensions of about 300 μm long, about 100 μm wide, and about 10 μm thick was applied so as to cover the opposite portion of the discharge electrode pastes.

(4) Stacking and Pressure Bonding

The second ceramic green sheet was stacked on the first ceramic green sheet coated with the discharge supporting electrode paste, the discharge electrode paste, and the hollow-portion-forming paste in this order, as described above, and a multilayer body was obtained by performing pressure bonding such that the total thickness became about 0.3 mm.

(5) Firing

The resulting multilayer body was cut into a chip having dimensions of about 1.0 mm×about 0.5 mm by using a micro-cutter, and firing was performed in a nitrogen atmosphere at about 900° C. to about 1,000° C. for about 90 minutes.

(6) Formation of Outer Electrode

Both ends of the fired chip were coated with the outer electrode paste and baking was performed so as to form the outer electrodes. Further, the outer electrodes were subjected to electrolytic Ni—Sn plating so as to complete the ESD protection device.

Samples 2 to 7

The ESD protection devices of Samples 2 to 7 were produced in the same procedure as that for Sample 1 except that the first and second ceramic green sheets were prepared using a ceramic powder including lithium in the amount shown in Table 1 below as the alkali metal element. The ceramic powder including lithium was prepared by compounding and mixing each of raw materials for forming LTCC containing lithium in the amount shown in Table 1 and performing calcination at about 800° C. to about 1,000° C.

The lithium concentration in the ceramic base material of each of the resulting ESD protection devices of Samples 1 to 7 was measured by the ICP emission spectrometry. The sample, in which a bulk portion of the ceramic base material was dissolved in an acid, was measured. As a result, it was ascertained that the lithium concentration in the ceramic base material was substantially the same as the lithium concentration in the ceramic powder serving as the raw material for forming the ceramic base material (that is, the value shown in Table 1).

The ESD protection devices of Samples 1 to 7 were evaluated as described below.

A cross-section of the ESD protection device was observed by a metallurgical microscope and a scanning electron microscope (SEM) and, thus, the presence or absence of peeling of the discharge electrode and the presence or absence of the occurrence of cracking resulting from expansion of the hollow portion were evaluated. Where peeling of the discharge electrode was observed was rated as "poor (x)", where peeling was not observed was rated as "good (○)", where the occurrence of cracking was observed was rated as "poor (x)", and where the occurrence of cracking was not observed was rated as "good (○)". Also, it was ascertained that the distance between the discharge electrodes of each Sample was about 30 μm.

The discharge characteristics of the ESD protection device were evaluated on the basis of the standard, IEC61000-4-2, specified by the International Electrotechnical Commission (IEC). The peak voltage value ($V_{peak}$) and the voltage value 30 ns after the wave front value ($V_{clamp}$) were measured under the condition at a contact discharge of 8 kV. The number of applications of contact discharge of each sample was set to be 20 times. Where $V_{peak}$ was about 700 V or more was rated as "poor (x)", where $V_{peak}$ was about 500 V or more and less than about 700 V was rated as "acceptable (Δ)", and where $V_{peak}$ was less than about 500 V was rated as "good (○)". Also, regarding $V_{clamp}$, where the number of times of "$V_{clamp}$<about 100 V" was less than 10 times was rated as "poor (x)", where the number was 10 to 19 times was rated as "acceptable (Δ)", and where the number was 20 times was rated as "good (○)".

The above-described results are shown in Table 1 below. Regarding overall judgement, where at least one item was "poor (x)" was rated as "poor (x)", where all items were "acceptable (Δ)" was rated as "acceptable (Δ)", where no item was "poor (x)", at least one item was "good (○)", and at least one item was "acceptable (Δ)" was rated as "good (○)", and where all items were "good (○)" was rated as "very good (⊙)".

TABLE 1

| Sample | Li content (percent by weight) | Peeling | Cracking | $V_{peak}$ | $V_{clamp}$ | Overall judgement |
|---|---|---|---|---|---|---|
| 1 | 0 | ○ | ○ | ○ | ○ | ⊙ |
| 2 | 0.5 | ○ | ○ | ○ | ○ | ⊙ |
| 3 | 1 | ○ | ○ | ○ | ○ | ⊙ |
| 4 | 3 | ○ | ○ | Δ | Δ | ○ |
| 5 | 5 | X | X | X | X | X |
| 6 | 7 | X | X | X | X | X |
| 7 | 10 | X | X | X | X | X |

In the ESD protection device of each of Samples 1 to 4 in which the lithium content (content of elemental alkali metal) in the ceramic base material was about 0 to about 3 percent by weight, the discharge electrodes were present along the discharge supporting electrode, and peeling of the discharge electrodes was not observed. The distance between the discharge electrodes in each of Samples 1 to 4 was almost equal. Also, in the ESD protection devices of Samples 1 to 4, an irregular shape, e.g., a crack, and a defective structure were not observed. The reason for this is considered to be that gas generation resulting from a decomposition reaction of silicon carbide in the discharge supporting electrode was reduced or prevented and, as a result, very little expansion of the hollow portion occurred. On the other hand, in the ESD protection devices of Samples 5 to 7, in which the lithium content was about 5 percent by weight or more, peeling of the discharge electrodes and occurrences of cracking were observed. The reason for this is considered to be that the hollow portion was excessively expanded by gas generation resulting from a decomposition reaction of silicon carbide in the discharge supporting electrode.

Meanwhile, when attention is directed toward the discharge characteristics, regarding the ESD protection devices of Samples 1 to 3, in which the lithium content in the ceramic base material was about 0 to about 1 percent by weight, both $V_{peak}$ and $V_{clamp}$ were rated as "good (○)", and regarding the ESD protection device of Sample 4, in which the lithium content was about 3 percent by weight, both were rated as "acceptable (Δ)". As is clear from these results, where the lithium content (content of elemental alkali metal) in the ceramic base material was about 3 percent by weight or less, the discharge characteristics of the ESD protection device were improved, and in the case of about 1 percent by weight or less, the discharge characteristics were further improved.

According to an overall judgement based on the individual characteristics, it was discovered that in the ESD protection device according to the first preferred embodiment, the lithium content (content of elemental alkali metal) in the ceramic base material was preferably about 3 percent by weight or less and more preferably about 1 percent by weight or less.

Example 2

ESD protection devices of Samples 8 to 14 related to the ESD protection device according to a second preferred embodiment of the present invention were produced in the procedure described below.

Sample 8

First and second ceramic green sheets, a discharge supporting electrode paste, a discharge electrode paste, a hollow-portion-forming paste, and an outer electrode paste were prepared in the same or substantially the same procedures as those for Sample 1.

An $Al_2O_3$ powder having an average particle diameter of about 2 μm and an organic vehicle were mixed so as to prepare the seal layer paste.

A first ceramic green sheet was coated with the seal layer paste having dimensions of about 400 μm long, about 300 μm wide, and about 10 μm thick. The resulting seal layer paste was coated with the discharge supporting electrode paste having dimensions of about 300 μm long, about 200 μm wide, and about 10 μm thick. Subsequently, the discharge electrode paste was applied such that a pair of discharge electrode pastes having dimensions of about 600 μm long, about 100 μm wide, and about 5 μm thick were opposed to each other in the length direction on the discharge supporting electrode paste. The distance between the pair of opposite discharge electrode pastes was set to be about 15 μm. Then, the hollow-portion-forming paste having dimensions of about 300 μm long, about 100 μm wide, and about 30 μm thick was applied so as to cover the opposite portion of the discharge electrode pastes. Finally, the seal layer paste having dimensions of about 300 μm long, about 100 μm wide, and about 10 μm thick was applied so as to cover the hollow-portion-forming paste.

The second ceramic green sheet was stacked on the first ceramic green sheet coated with the seal layer paste, the discharge supporting electrode paste, the discharge electrode paste, the hollow-portion-forming paste, and the seal layer paste in this order, as described above, and a multilayer body was obtained by performing pressure bonding such that the total thickness was about 0.3 mm.

The resulting multilayer body was cut, firing was performed, and the outer electrodes were formed in the same or substantially the same procedure as that for Sample 1 so as to complete the ESD protection device of Sample 8.

Samples 9 to 14

The ESD protection devices of Samples 9 to 14 were produced in the same or substantially the same procedure as that for Sample 8 except that the first and second ceramic green sheets were prepared using a ceramic powder including lithium in the amount shown in Table 2 below as the alkali metal element. The ceramic powder including lithium was prepared by compounding and mixing each of raw materials for forming LTCC containing lithium in the amount shown in Table 2 and performing calcination at about 800° C. to about 1,000° C.

The lithium concentration in the ceramic base material of each of the resulting ESD protection devices of Samples 8 to 14 was measured by the ICP emission spectrometry. The sample, in which a bulk portion of the ceramic base material was dissolved in an acid, was measured. As a result, it was ascertained that the lithium concentration in the ceramic base material was substantially the same as the lithium concentration in the ceramic powder serving as the raw material for forming the ceramic base material (that is, the value shown in Table 2).

Regarding the ESD protection devices of Samples 8 to 14, the presence or absence of peeling of discharge electrode and the occurrence of cracking were evaluated in the same or substantially the same procedure as that in Example 1. The results are shown in Table 2. In this regard, judgments "⊚", "○", "Δ", and "x" in Table 2 are the same as those of the judgments in Table 1 above.

TABLE 2

| Sample | Li content (percent by weight) | Peeling | Cracking | Discharge characteristics $V_{peak}$ | $V_{clamp}$ | Overall judgement |
|---|---|---|---|---|---|---|
| 8 | 0 | ○ | ○ | ○ | ○ | ⊚ |
| 9 | 0.5 | ○ | ○ | ○ | ○ | ⊚ |
| 10 | 1 | ○ | ○ | ○ | ○ | ⊚ |
| 11 | 3 | ○ | ○ | ○ | ○ | ⊚ |
| 12 | 5 | ○ | ○ | Δ | Δ | ○ |
| 13 | 7 | X | X | X | X | X |
| 14 | 10 | X | X | X | X | X |

In the ESD protection device of each of Samples 8 to 12 in which the lithium content (content of elemental alkali metal) in the ceramic base material was about 0 to about 5 percent by weight, the discharge electrodes were present along the discharge supporting electrode, and peeling of the discharge electrodes was not observed. The distance between the discharge electrodes in each of Samples 8 to 12 was almost equal. Also, in the ESD protection devices of Samples 8 to 12, an irregular shape, e.g., a crack, and a defective structure were not observed. The reason for this is considered to be that gas generation resulting from a decomposition reaction of silicon carbide in the discharge supporting electrode was reduced or prevented and, as a result, very little expansion of the hollow portion occurred. On the other hand, in the ESD protection devices of Samples 13 and 14, in which the lithium content was about 7 percent by weight or more, peeling of the discharge electrodes and occurrences of cracking were observed. The reason for this is considered to be that the hollow portion was excessively expanded by gas generation resulting from a decomposition reaction of silicon carbide in the discharge supporting electrode.

When Example 1 and Example 2 are compared, where the seal layer was not provided (Example 1), peeling of the discharge electrodes and the occurrence of cracking were observed in Sample in which the lithium content was about 5 percent by weight, whereas where the seal layer was provided (Example 2), peeling of the discharge electrodes and the occurrence of cracking were not observed in Sample 12 in which the lithium content was about 5 percent by weight. Consequently, it was discovered that intrusion of the alkali metal element in the ceramic base material into the discharge supporting electrode was reduced or prevented, and even where the content of elemental alkali metal in the ceramic base material was a relatively high value of about 5 percent by weight, gas generation resulting from a decomposition reaction of silicon carbide in the discharge supporting electrode and thus causing expansion of the hollow portion were reduced or prevented by providing the seal layer.

Meanwhile, when attention is directed toward the discharge characteristics, regarding the ESD protection devices of Samples 8 to 11, in which the lithium content in the ceramic base material was about 0 to about 3 percent by weight, both $V_{peak}$ and $V_{clamp}$ were rated as "good (○)", and regarding the ESD protection device of Sample 12, in which the lithium content was about 5 percent by weight, both were rated as "acceptable (Δ)". As is clear from these results, where the lithium content (content of elemental alkali metal) in the ceramic base material was about 5 percent by weight or less, the discharge characteristics of the ESD protection device were improved, and in the case of about 3 percent by weight or less, the discharge characteristics were further improved. Also, when Example 1 and Example 2 are compared, it is clear that even where the content of elemental alkali metal in the ceramic base material was a relatively high value of about 5 percent by weight, sufficient discharge characteristics were able to be achieved by providing the seal layer.

According to the overall evaluation based on the individual characteristics, it was discovered that in the ESD protection device according to the second preferred embodiment, the lithium content (content of elemental alkali metal) in the ceramic base material was preferably about 5 percent by weight or less and more preferably about 3 percent by weight or less.

The ESD protection device according to preferred embodiments of the present invention reliably exhibit good discharge characteristics, and damage to the electronic equipment, malfunction, and other problems resulting from ESD are effectively prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electro-static discharge protection device comprising:
    a ceramic base material;
    first and second outer electrodes disposed on an outer surface of the ceramic base material;
    a hollow portion located inside the ceramic base material;
    a first discharge electrode including a first end portion that is electrically connected to the first outer electrode and a second end portion that is disposed in the hollow portion;
    a second discharge electrode including a first end portion that is electrically connected to the second outer electrode and a second end portion that is spaced apart from the first discharge electrode in the hollow portion; and
    a discharge supporting electrode, which includes silicon carbide and which is disposed between the second end portion of the first discharge electrode and the second end portion of the second discharge electrode; wherein
    the ceramic base material includes an alkali metal element, and a content of the alkali metal element in the ceramic base material is about 3 percent by weight or less.

2. The electro-static discharge protection device according to claim 1, wherein the content of the alkali metal element in the ceramic base material is about 0.1 to about 1 percent by weight.

3. The electro-static discharge protection device according to claim 1, wherein the second end portion of the first discharge electrode and the second end portion of the second discharge electrode oppose each other in the hollow portion.

4. The electro-static discharge protection device according to claim 1, wherein a portion of a side portion between the first end portion and the second end portion of the first discharge electrode and a portion of a side portion between the first end portion and the second end portion of the second discharge electrode oppose each other in the hollow portion.

5. The electro-static discharge protection device according to claim 1, wherein the ceramic base material is a low temperature cofirable ceramic material.

6. The electro-static discharge protection device according to claim 5, wherein the low temperature cofirable ceramic material includes Si and Al as primary components.

7. The electro-static discharge protection device according to claim 1, wherein an upper surface of the hollow portion is curved.

8. The electro-static discharge protection device according to claim 1, wherein the hollow portion has dimensions larger than dimensions of the discharge supporting electrode in plan view.

9. The electro-static discharge protection device according to claim 1, wherein the hollow portion has dimensions smaller than dimensions of the discharge supporting electrode in plan view.

10. An electro-static discharge protection device comprising:
    a ceramic base material;
    first and second outer electrodes disposed on an outer surface of the ceramic base material;
    a hollow portion located inside the ceramic base material;
    a first discharge electrode including a first end portion that is electrically connected to the first outer electrode and a second end portion that is disposed in the hollow portion;
    a second discharge electrode including a first end portion that is electrically connected to the second outer electrode and a second end portion that is spaced apart from the first discharge electrode in the hollow portion; and
    a discharge supporting electrode, which includes silicon carbide and which is disposed between the second end portion of the first discharge electrode and the second end portion of the second discharge electrode; wherein
    a seal layer is disposed in at least a portion of a region between the discharge supporting electrode and the ceramic base material; and
    the ceramic base material includes an alkali metal element, and a content of the alkali metal element in the ceramic base material is about 5 percent by weight or less.

11. The electro-static discharge protection device according to claim 10, wherein the content of the alkali metal element in the ceramic base material is about 0.1 to about 3 percent by weight.

12. The electro-static discharge protection device according to claim 10, wherein the seal layer covers substantially an entire inner surface of the hollow portion.

13. The electro-static discharge protection device according to claim 10, wherein the second end portion of the first discharge electrode and the second end portion of the second discharge electrode oppose each other in the hollow portion.

14. The electro-static discharge protection device according to claim 10, wherein a portion of a side portion between the first end portion and the second end portion of the first discharge electrode and a portion of a side portion between the first end portion and the second end portion of the second discharge electrode oppose each other in the hollow portion.

15. The electro-static discharge protection device according to claim 10, wherein the ceramic base material is a low temperature cofirable ceramic material.

16. The electro-static discharge protection device according to claim 15, wherein the low temperature cofirable ceramic material includes Si and Al as primary components.

17. The electro-static discharge protection device according to claim 10, wherein an upper surface of the hollow portion is curved.

18. The electro-static discharge protection device according to claim 10, wherein the hollow portion has dimensions larger than dimensions of the discharge supporting electrode in plan view.

19. The electro-static discharge protection device according to claim 10, wherein the hollow portion has dimensions smaller than dimensions of the discharge supporting electrode in plan view.

* * * * *